US008013371B2

(12) United States Patent
Zheng et al.

(10) Patent No.: US 8,013,371 B2
(45) Date of Patent: Sep. 6, 2011

(54) ULTRA THIN TCS (SICL$_4$) CELL NITRIDE FOR DRAM CAPACITOR WITH DCS (SIH$_2$CL$_2$) INTERFACE SEEDING LAYER

(75) Inventors: Lingyi A Zheng, Boise, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/793,587

(22) Filed: Mar. 4, 2004

(65) Prior Publication Data

US 2004/0169259 A1    Sep. 2, 2004

Related U.S. Application Data

(60) Continuation of application No. 09/922,628, filed on Aug. 6, 2001, now Pat. No. 6,704,188, which is a division of application No. 09/653,523, filed on Aug. 31, 2000, now Pat. No. 6,465,373.

(51) Int. Cl.
*H01L 27/108* (2006.01)
*H01L 21/318* (2006.01)
*H01L 23/58* (2006.01)

(52) U.S. Cl. ........ 257/296; 257/410; 257/411; 257/532; 257/640; 257/649; 257/E21.646; 257/E27.016

(58) Field of Classification Search .............. 257/635, 257/637, 638, 640, 649, 296, 410, 411, 532, 257/E21.646, E27.016; 438/791
See application file for complete search history.

(56) References Cited

U.S. PATENT DOCUMENTS

| | | | | | |
|---|---|---|---|---|---|
| 4,395,438 | A | * | 7/1983 | Chiang | 438/791 |
| 4,546,016 | A | | 10/1985 | Kern | |
| 4,557,950 | A | | 12/1985 | Foster et al. | |
| 4,641,170 | A | | 2/1987 | Ogura et al. | 357/35 |
| 4,962,065 | A | * | 10/1990 | Brown et al. | 438/792 |
| 4,963,506 | A | | 10/1990 | Liaw et al. | 438/482 |
| 5,663,087 | A | | 9/1997 | Yokozawa | 438/762 |
| 5,714,408 | A | * | 2/1998 | Ichikawa et al. | 438/761 |
| 5,882,978 | A | | 3/1999 | Srinivasan et al. | 438/396 |
| 5,899,752 | A | * | 5/1999 | Hey et al. | 438/791 |
| 5,906,861 | A | | 5/1999 | Mack et al. | |
| 5,939,333 | A | | 8/1999 | Hurley et al. | 438/241 |
| 5,972,804 | A | * | 10/1999 | Tobin et al. | 438/786 |
| 5,981,404 | A | | 11/1999 | Sheng et al. | 438/791 |
| 6,027,984 | A | | 2/2000 | Thakur et al. | 438/440 |
| 6,063,713 | A | | 5/2000 | Doan | 438/763 |
| 6,077,754 | A | | 6/2000 | Srinivasan et al. | 38/396 |
| 6,127,287 | A | | 10/2000 | Hurley et al. | 438/791 |
| 6,147,013 | A | | 11/2000 | Sun et al. | 438/791 |
| 6,162,679 | A | | 12/2000 | Lin | 438/253 |
| 6,165,916 | A | * | 12/2000 | Muraoka et al. | 438/791 |
| 6,171,977 | B1 | | 1/2001 | Kasai et al. | 438/775 |
| 6,251,802 | B1 | | 6/2001 | Moore et al. | 438/778 |
| 6,258,690 | B1 | | 7/2001 | Zenke | 438/396 |
| 6,265,741 | B1 | | 7/2001 | Schrems | 257/301 |
| 6,268,299 | B1 | | 7/2001 | Jammy et al. | 438/791 |
| 6,284,583 | B1 | | 9/2001 | Saida et al. | 438/216 |
| 6,348,420 | B1 | * | 2/2002 | Raaijmakers et al. | 438/769 |
| 6,355,582 | B1 | * | 3/2002 | Hosoda et al. | 438/791 |
| 6,380,056 | B1 | | 4/2002 | Shue et al. | |
| 6,465,373 | B1 | | 10/2002 | Zheng et al. | 438/794 |
| 6,498,063 | B1 | | 12/2002 | Ping | 438/253 |
| 6,566,186 | B1 | * | 5/2003 | Allman et al. | 438/239 |
| 6,765,254 | B1 | * | 7/2004 | Hui et al. | 257/296 |
| 6,774,462 | B2 | * | 8/2004 | Tanaka et al. | 257/639 |
| 6,905,982 | B2 | * | 6/2005 | Sato et al. | 438/792 |
| 6,933,245 | B2 | * | 8/2005 | Lee et al. | 438/778 |
| 7,344,976 | B2 | | 3/2008 | Yoshida et al. | |
| 7,651,910 | B2 | | 1/2010 | Beaman et al. | |
| 2001/0024867 | A1 | * | 9/2001 | Saida et al. | 438/490 |
| 2003/0020138 | A1 | | 1/2003 | Zheng | 257/534 |
| 2003/0022436 | A1 | | 1/2003 | Zheng | 438/244 |

FOREIGN PATENT DOCUMENTS

| | | | |
|---|---|---|---|
| JP | 08031818 A | | 2/1996 |
| JP | 09-050996 | * | 2/1997 |
| JP | 10-251005 | * | 9/1998 |

OTHER PUBLICATIONS

Merriam-Webster Online Dictionary www.m-w.com.*
Ino et al., "Silicon Nitride Thin-Film Deposition by LPCVD with In Situ HF Vapor Cleaning and Its Application to stacked DRAM Capacitor Fabrication", IEEE Transactions on Electron Devices, vol. 41, No. 5, May 1994, pp. 703-708.*
Merriam-Webster Online Dictionary www.m-w.com, Mar. 2007.*
Merriam-Webster Online Dictionary www.m-w.com, Apr. 2006.*

* cited by examiner

*Primary Examiner* — Evan Pert
(74) *Attorney, Agent, or Firm* — Whyte Hirschboeck Dudek SC

(57) ABSTRACT

A method for forming silicon nitride films on semiconductor devices is provided. In one embodiment of the method, a silicon-comprising substrate is first exposed to a mixture of dichlorosilane (DCS) and a nitrogen-comprising gas to deposit a thin silicon nitride seeding layer on the surface, and then exposed to a mixture of silicon tetrachloride (TCS) and a nitrogen comprising gas to deposit a TCS silicon nitride layer on the DCS seeding layer. In another embodiment, the method involves first nitridizing the surface of the silicon-comprising substrate prior to forming the DCS nitride seeding layer and the TCS nitride layer. The method achieves a TCS nitride layer having a sufficient thickness to eliminate bubbling and punch-through problems and provide high electrical performance regardless of the substrate type. Also provided are methods of forming a capacitor, and the resulting capacitor structures.

30 Claims, 8 Drawing Sheets

ULTRA THIN TCS (SICL₄) CELL NITRIDE FOR DRAM CAPACITOR WITH DCS (SIH₂CL₂) INTERFACE SEEDING LAYER

CROSS-REFERENCE TO RELATED APPLICATIONS

This application is a continuation of U.S. patent application Ser. No. 09/922,628, filed Aug. 6, 2001, which is a division of U.S. patent application Ser. No. 09/653,523, filed Aug. 31, 2000.

TECHNICAL FIELD

The present invention relates to the fabrication of integrated circuit devices, and more particularly, to methods of forming silicon nitride layers on silicon-comprising substrate surfaces, methods of forming capacitors, and to capacitor constructions.

BACKGROUND OF THE INVENTION

Silicon nitride ($Si_3N_4$) layers are frequently used in the fabrication of semiconductor wafers, for example, in the fabrication of MOSFET gates, memory cells, and precision capacitors. Silicon nitride layers are utilized as an insulation layer over silicon surfaces to electrically isolate conductive components of a semiconductor circuit from one another. Silicon nitride films are also used as a diffusion barrier to protect regions of a semiconductor wafer during local oxidation of silicon due to the slow speed with which oxygen and water vapor diffuse in the nitride. Silicon nitride dielectric films are preferred over silicon dioxide ($SiO_2$) in many applications due to its high dielectric constant (6-9 versus about 4.2 for chemical vapor deposited (CVD) $SiO_2$).

Capacitors are commonly-used electrical components of semiconductor circuitry. A typical capacitor is constructed of two conductive plates separated by a non-conducting dielectric layer. The capacitor is electrically connected to a circuit external of the capacitor. The dielectric layer is preferably comprised of one or more materials having a very high dielectric constant and low leakage current characteristics, for example, $SiO_2$ and $Si_3N_4$, with $Si_3N_4$ being typically preferred due to its higher dielectric constant.

Silicon nitride is typically deposited upon a silicon surface (including, but not limited to, single crystal, poly, and epitaxial), by low pressure chemical vapor deposition (LPCVD). In a conventional silicon nitride LPCVD deposition, the silicon surface is normally pretreated, for example, by removing the native oxide using a hydrofluoric acid (HF) clean solution. A film of silicon nitride is then deposited on the pretreated surface by LPCVD by reacting dichlorosilane ($SiH_2Cl_2$) and ammonia ($NH_3$) over the silicon surface in a hot-wall reactor at about 600 to about 800° C. and a pressure of about 100 mTorr to about 2 Torr.

An alternate process for producing a $Si_3N_4$ layer is by rapid thermal nitridation (RTN) of a silicon layer which is annealed in an $NH_3$ or other nitrogen-comprising atmosphere, which reacts with the silicon to produce silicon nitride. However, the growth of the nitride is extremely slow and self-limiting since the $NH_3$ is not capable of adequately diffusing through the growing silicon nitride layer to react with the underlying silicon. The ultimate thickness of a silicon nitride film produced by nitridation is typically only 3 to 4 nm at high temperatures. Such thickness is usually too low to adequately function as a barrier to prevent further oxidation of the silicon surface during subsequent processing, or as a capacitor dielectric layer between two conductive capacitor plates. Further, the electrical quality of this high temperature nitridated layer is poor.

Another described technique for formation of $Si_3N_4$ capacitor dielectric layers is to initially nitridize an outer silicon surface to obtain a 20 to 30 angstrom thick layer, and then deposit a silicon nitride film by low pressure chemical vapor deposition of DCS. The drawbacks of these methods include poor electrical performance of the RTN/DCS layer and high thermal budget induced from the high temperature RTN process.

Surface properties of the wafer surface play an important role in the initial growth of films in thin-film processes, which will impact the properties and structure of the thin film that is deposited. Different nucleation and deposition rates occur for the deposition of silicon nitride on different wafer surfaces. This leads to different or degraded electrical characteristics of semiconductor devices having different wafer surfaces that are fabricated using a silicon nitride deposited layer. In addition, deposition of silicon nitride also includes an incubation time at the start of the deposition where there is no apparent deposition of silicon nitride. The incubation time may extend up to several minutes for some surfaces. Surfaces exhibiting such different rates and incubation times include, but are not limited to, one or more of tetraethylorthosilicate (TEOS), borophosphosilicate glass (BPSG), silicon, polysilicon, hemispherical grain (HSG) polysilicon, other doped silicon or polysilicon surfaces, other doped oxides, thermal silicon dioxide, chemical vapor deposited (CVD) silicon dioxide, and plasma enhanced CVD (PECVD) silicon dioxide.

TCS nitride layers ($SiCL_4$ reacted with $NH_3$) have been shown to have much better capacitance (Cp)-leakage performance than silicon nitride layers produced by dichlorosilane (DCS) in DRAM capacity modules. However, there have been problems with nucleation of TCS nitride on certain silicon-based surfaces such as borophosphosilicate glass (BPSG) using current TCS cell nitride processes.

An example of a prior art process for depositing a TCS silicon nitride layer in a DRAM capacity module is described with reference to FIGS. 1A-1B. Referring to FIG. 1A, an exemplary semiconductor wafer fragment 10, shown in a preliminary processing step, comprises a base layer 12, an insulative layer 14 of BPGS formed over base layer 12, an HSG polysilicon layer 16 overlying the BPSG insulative layer 14, and an opening 18. As shown in FIG. 1B, the HSG polysilicon layer 16 is incorporated into a capacitor construction 20 in which a silicon nitride-comprising dielectric layer 22 comprising a TCS nitride layer 24 and a capacitor plate layer 26, are formed over the HSG polysilicon layer 16. In a conventional process, the TCS nitride layer 24 can be deposited over both the BPSG layer 14 and the HSG polysilicon layer 16 by LPCVD by reacting silicon tetrachloride ($SiCl_4$) and ammonia ($NH_3$) over the substrate in a hot-wall reactor at about 500 to about 800° C. and a pressure of about 100 mTorr to about 2 Torr.

As depicted in FIG. 1B, transmission electron microscopy (TEM) cross-sectional images have shown that portion "A" of the TCS nitride layer 24 deposited on the surface of the BPSG substrate 14 to be comparatively thinner (about 15 to about 20 angstroms) than the thickness of portion "B" of the TCS nitride layer 24 deposited on the HSG polysilicon substrate 18 (about 45 to about 50 angstroms).

At a thickness of less than about 20 angstroms, the nitride is not able to prevent the polysilicon electrode from becoming oxidated in the wet re-oxidation step that follows the cell nitride deposition. Consequently, re-oxidation results in the oxidation of the bottom polysilicon electrode. The volume expansion from the polysilicon oxidation will force the BPSG container sidewall to "bulge out" of the wafer surface. These bulges appear as "bubbling" from a top view in a Scanning Electron Microscopy (SEM) image. This is commonly referred to as "BPSG bubbling" and the nitride is said to be "punched through". These bubblings are fatal physical defects and will result in massive fail of the part. Beside preventing the BPSG bubbling problem, a desirable thickness of nitride on the BPSG also functions as a $H_2$ barrier in the subsequent wet re-oxidation and other processes to protect the active area in the device because $H_2$ could enhance boron diffusion and deactivate the transistor. The poor nucleation of TCS nitride on BPSG has limited the use of TCS nitride to below about 50 angstroms in current DRAM capacity modules.

Therefore, it is desirable to develop an improved process of forming dielectric silicon nitride films with TCS that will overcome the shortcomings of present TCS nitride processes. It is also desirable to provide an improved process to enable the production of a silicon nitride layer using TCS that will be of adequate thickness over substantially all silicon substrates of a device to provide the desired capacitor dielectric properties in a capacitor construction, and improve the characteristics of the fabricated semiconductors devices.

SUMMARY OF THE INVENTION

The present invention provides an improved method for forming silicon nitride films on semiconductor devices.

The present invention combines depositing a DCS nitride seeding layer with depositing a TCS nitride layer on a silicon-comprising substrate to improve the thickness of a dielectric silicon nitride layer deposited using TCS on silicon-comprising substrates of a semiconductor device being constructed. Before the deposition of the TCS nitride, a thin layer of DCS nitride is deposited as an interface "seeding layer" on the surface of the silicon-comprising substrate for the formation of the TCS nitride layer such as by low pressure chemical vapor deposition (LPCVD). Advantageously, the DCS seeding layer can be deposited without a conventionally used $NH_3$ pre-anneal nitridation step, by utilizing a pressure of about 1-3 Torr in the reaction chamber.

In one embodiment of the method of the invention, a silicon nitride layer is formed on a surface of a silicon-comprising substrate by first depositing a DCS nitride seeding layer on the surface to a thickness of up to about 5 angstroms, and then depositing a TCS silicon nitride layer on the DCS silicon nitride layer to a desired thickness for the application.

In another embodiment, the invention provides a method of forming a silicon nitride layer on a surface of a silicon-comprising substrate by first nitridizing the surface by exposure to a nitrogen-comprising gas of at least one of $N_2$, $NH_3$ or $NO_x$, preferably $NH_3$, to form at least a monolayer of silicon nitride to a thickness of less than about 5 angstroms. A DCS silicon nitride seeding layer is then deposited on the nitridated surface to a thickness of up to about 5 angstroms, and a TCS silicon nitride layer is then deposited on the DCS silicon nitride seeding layer to a desired thickness, typically about 40-50 angstroms or less.

In another method of the present invention, a silicon nitride layer is formed on a surface of a silicon-comprising substrate that includes two or more discrete areas comprised of different silicon-comprising materials, for example, TEOS, BPSG, polysilicon, HSG polysilicon, among others. A silicon nitride layer is formed on the surface of the various silicon-comprising substrates by depositing a thin DCS silicon nitride seeding layer on the surface to a thickness of up to about 5 angstroms, and then depositing a TCS silicon nitride layer on the DSC silicon nitride layer to a desired thickness. The cross-wafer thickness of the TCS silicon nitride layer is substantially equivalent over the entire substrate surface, regardless of the silicon-comprising substrate.

In yet another method of the invention, the surface of two or more discrete areas of different silicon-comprising substrates is nitridized to form at least a monolayer of silicon nitride thereon, and a silicon nitride layer is deposited on the surface of the nitridated layer. The silicon nitride layer is formed by depositing a DCS silicon nitride seeding layer on the nitridated layer, and then depositing a TCS silicon nitride layer on the DSC silicon nitride layer. The cross-wafer thickness of the resulting silicon nitride layer is substantially equivalent from area to area over the surface of the substrate.

In another aspect, the invention encompasses a method of forming a capacitor. The method includes forming a first capacitor plate comprising a silicon-comprising substrate, for example, HSG polysilicon, forming a dielectric layer of silicon nitride proximate the first capacitor plate, and forming a second capacitor plate over the silicon nitride layer. The silicon nitride layer is formed by first depositing a thin DCS silicon nitride seeding layer of up to about 5 angstroms on the surface of the first capacitor plate, and then depositing a TCS silicon nitride layer on the DSC silicon nitride seeding layer, to a desired thickness, for example, about 40-50 angstroms. Preferably, the DCS and TCS silicon nitride layers are deposited by chemical vapor deposition, preferably by LPCVD.

In another method of forming a capacitor according to the invention, a capacitor is prepared by forming a first capacitor plate comprising a silicon-comprising substrate surface such as HSG polysilicon, a silicon nitride dielectric layer proximate the first capacitor plate, and a second capacitor plate over the dielectric layer. The silicon-based substrate surface of the first capacitor plate is nitridized in a nitrogen-comprising ambient, preferably $NH_3$, to form from one to three monolayers of silicon nitride on the substrate surface, preferably up to about 2 angstroms. A thin DCS silicon nitride seeding layer of about to about 5 angstroms is then deposited on the nitridated silicon-based surface, and a TCS nitride layer is deposited on the DSC nitride layer to the desired thickness.

In another aspect, the invention provides a capacitor. The capacitor includes a first capacitor plate comprising a silicon-comprising substrate, a second capacitor plate, and a dielectric silicon nitride layer intermediate the first and second capacitor plates. In a first embodiment of a capacitor according to the invention, the silicon nitride layer is composed of a thin DCS silicon nitride seeding layer up to about 5 angstroms deposited on the first capacitor plate, and a TCS silicon nitride layer deposited on the DSC silicon nitride layer to a desired thickness.

In another embodiment, the capacitor includes a silicon nitride layer intermediate first and second capacitor plates, the silicon nitride layer composed of a nitridized layer of silicon nitride on the surface of the first capacitor plate, preferably up to about 2 angstroms thick or from three to less than one monolayers of silicon nitride, a thin DCS nitride seeding layer of up to about 5 angstroms deposited on the nitridated layer, and a TCS nitride layer deposited on the DSC silicon nitride layer to a desired thickness.

Semiconductor devices fabricated with the silicon nitride deposition method according to the present invention to provide a DCS/TCS nitride layer, have substantially the same electrical performance as a conventional device fabricated with a silicon nitride layer made of TCS nitride alone, and improved Cp-leakage performance over a device made with a DCS nitride layer alone. Also, with the use of the DCS seeding layer, the nucleation and deposition rate of the TCS nitride component upon the substrate is substantially equivalent regardless of the silicon-comprising material that constitutes the substrate. This alleviates the problem of different or degraded electrical characteristics that result from the differences in the nitride thickness deposited on adjacent surfaces. Such differences are especially apparent, for example, between a conductor composed of silicon, and an insulator composed of TEOS, where a relatively thin nitride layer deposited at a silicon/TEOS edge can result in degraded electrical properties at that edge and for the resulting fabricated device.

The use of the DCS/TCS nitride layer also resolves the fatal BPSG bubbling problem that occurs with TCS nitride layers that are deposited directly on BPSG substrates in semiconductor devices. Additionally, the elimination of a high temperature $NH_3$ pre-anneal step from the process conserves the thermal budget for other processes in the fabrication operation.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 4a: standard TCS deposition on BPSG (TEL baseline TCS process with nitride measured thickness of 51 Å shows severe "bubbling" of the BPSG). FIG. 4b: two-minute DCS seeding deposition preceding a TCS deposition (with nitride measured thickness of 51 Å does not show "bubbling" of BPSG). FIG. 4c: five-minute DCS seeding deposition before TCS deposition (with nitride measured thickness of 48 Å does not show "bubbling" of BPSG). FIG. 4d: standard DCS nitride deposition (ASM DCS nitride with thickness of 56 Å does not show "bubbling" of BPSG). FIG. 4e: twenty-minute $NH_3$ pre-anneal before TCS deposition (with nitride measured thickness of 52 Å shows slight "bubbling" of the BPSG). FIG. 4f: twenty-minute $NH_3$ pre-anneal before TCS deposition (with nitride measured thickness of 47 Å shows "bubbling" of the BPSG).

DETAILED DESCRIPTION OF THE PREFERRED EMBODIMENTS

The present invention encompasses methods of forming silicon nitride dielectric layers, methods of incorporating such dielectric layers into capacitor constructions, and capacitors formed from such methods.

The surface of a semiconductor device being fabricated can include one or more of any one of the different types of surfaces as described above, including but not limited to wafer surfaces such as tetraethylorthosilicate (TEOS), borophosphosilicate glass (BPSG), silicon, polysilicon, HSG polysilicon, other doped silicon or polysilicon surfaces, other doped oxides, thermal silicon dioxide, chemical vapor deposited (CVD) silicon dioxide, plasma enhanced CVD (PECVD) silicon dioxide, or any other film or surface upon which silicon nitride would be deposited in the fabrication of semiconductor devices. The method of the present invention can be utilized with regard to any of the foregoing substrates to deposit a suitable TCS nitride layer thereon.

Figure 1A:
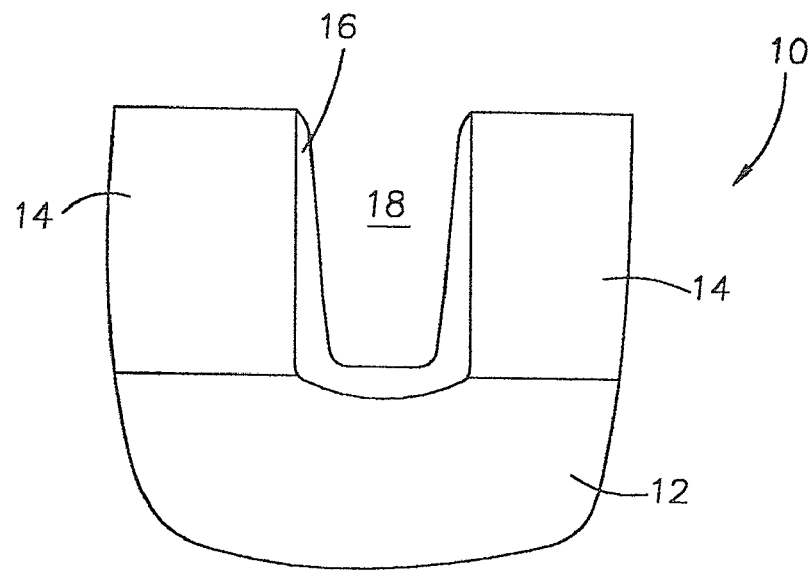
FIG. 1A is a diagrammatic cross-sectional view of a semiconductor wafer fragment at a preliminary step of a prior art processing sequence.
Figure 1B:
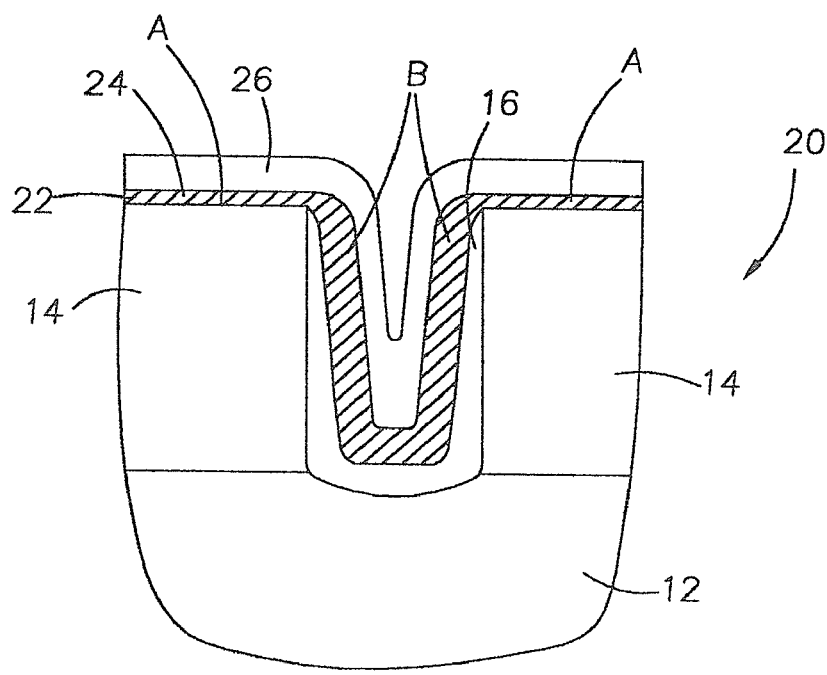
FIG. 1B is a view of the wafer fragment of FIG. 1A at a step subsequent to FIG. 1A to form a capacitor.
Figure 2A:
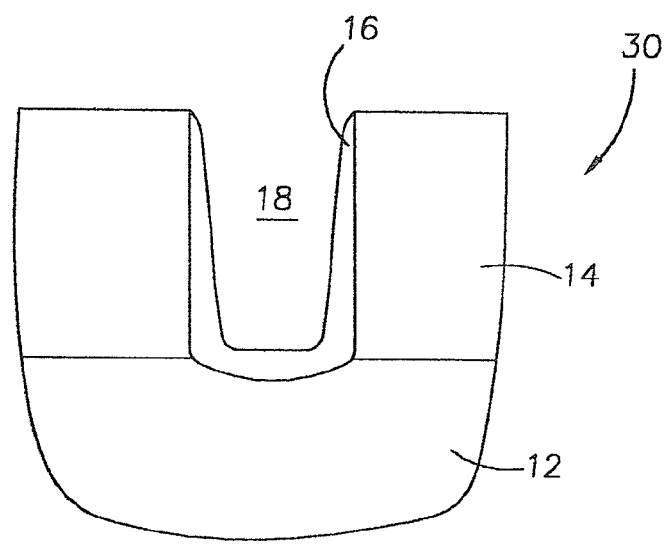
FIG. 2A is a diagrammatic cross-sectional view of a semiconductor wafer fragment at a preliminary step of a processing sequence to form a capacitor according to a first embodiment of the method of the present invention.

A first embodiment of a method of the present invention is described with reference to FIGS. 2A-2D, in a method of forming a capacitor. Referring to FIG. 2A, a semiconductor wafer fragment 30 is shown at a preliminary processing step of the method of the invention, and is identical to prior art wafer fragment 10. Wafer fragment 30 comprises a base layer 12, an insulative layer 14 deposited onto the base layer 12, a silicon layer 16 overlying the insulative layer 14, and an opening 18.

An exemplary base layer 12 is, for example, a monocrystalline silicon wafer lightly doped with a background p-type dopant. An exemplary material for the insulative layer 14 is BPSG, and for the silicon layer 16 is HSG polysilicon, which can be formed, for example, by converting an amorphous silicon layer deposited by on the insulative layer by conventional methods such as chemical vapor deposition, and converted to an HSG layer by seeding and annealing procedure, such as described in U.S. Pat. Nos. 5,634,974 and 5,691,288, the disclosures of which are incorporated herein by reference.

Referring to FIGS. 2A-2D, the HSG polysilicon layer 16 is incorporated into a capacitor construction 40, as a first capacitor plate layer. The silicon nitride-comprising dielectric layer 22 is formed over the BPSG insulative layer 14 and the HSG polysilicon layer 16, and then a capacitor plate layer 26, for example, a CVD conductively doped polysilicon, is formed over the silicon nitride-comprising dielectric layer 22.

Figure 2B:
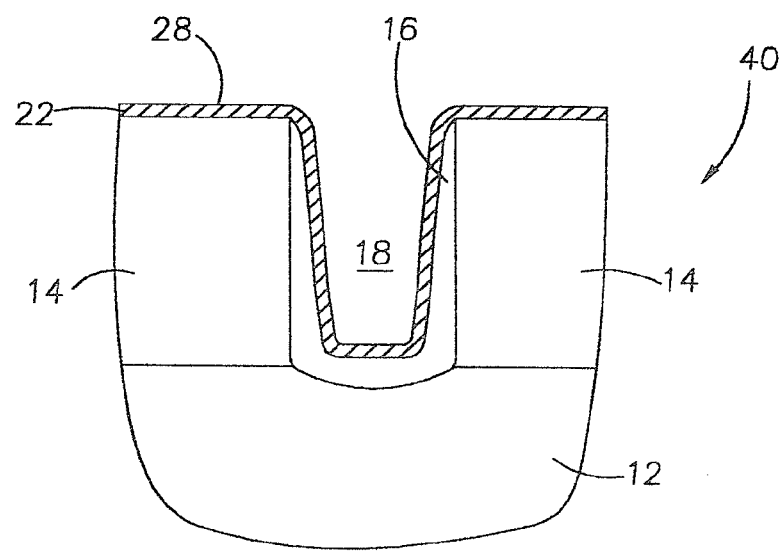
FIGS. 2B-2D are views of the wafer fragment of FIG. 2A at subsequent and sequential processing steps.

In forming the capacitor 40, it is important to achieve a silicon nitride-comprising dielectric layer 22 having a substantially equivalent thickness over both surface types, as previously described. To achieve this according to a first embodiment of the method of the invention, a DCS nitride seeding layer 28 is deposited on to the surfaces of the BPSG insulative layer 14 and the HSG polysilicon layer 16 prior to depositing the TCS nitride layer 24, as shown in FIG. 2B.

Although not shown, as a preliminary step prior to depositing the silicon nitride layer 22, it is preferred to remove any oxide that may be formed on the surface of the wafer from exposure to oxygen. Native oxide that is formed on the wafer surface can be removed, for example, with an in situ oxide wet clean utilizing HF, such as by immersion in an HF solution, or by HF vapor treatment, with or without agitation or scrubbing, according to methods known to persons of ordinary skill in the art. The HF-cleaned surface is then rinsed in deionized water and dried. Other pretreatment or cleaning processes may include the use of $NH_4F$ solution, $NH_4F/HF$ solution or buffered oxide etch (BOE), or any other cleaning solution known to one skilled in the art to provide a hydrophobic oxide free surface.

A conventional low pressure chemical vapor deposition (LPCVD) process can be used for depositing the thin DCS silicon nitride seeding layer 28 on the wafer surface. An exemplary DCS silicon nitride deposition by an LPCVD process can include reacting dichlorosilane ($SiH_2Cl_2$) and ammonia ($NH_3$) at a temperature of about 600° C. to about 800° C., a pressure in the range of about 1500 mTorr to about 500 mTorr, with a $NH_3:SiH_2Cl_2$ ratio of about 3:1 to about 10:1, to deposit a thin layer 28 of DCS silicon nitride having a thickness of up to about 5 angstroms, preferably about 3 to about 8 angstroms. The seeding layer can also be made, for example, by $SiH_4/NH_3$ and $Si_2H_6/NH_3$ systems, which are known to have good nucleation on oxide.

A preferred method for deposition of the DCS silicon nitride seeding layer 28 is by LPCVD using dichlorosilane and ammonia. The preferred conditions for LPCVD include a temperature in the range of about 600° C. to about 800° C., a pressure in the range of about 50 mTorr to about 1500 mTorr, and an $NH_3:DCS$ ratio in the range of about 3:1 to about 10:1, preferably about 4:1 to about 6:1, to deposit a layer of about 3 angstroms to about 8 angstroms.

Figure 2C:
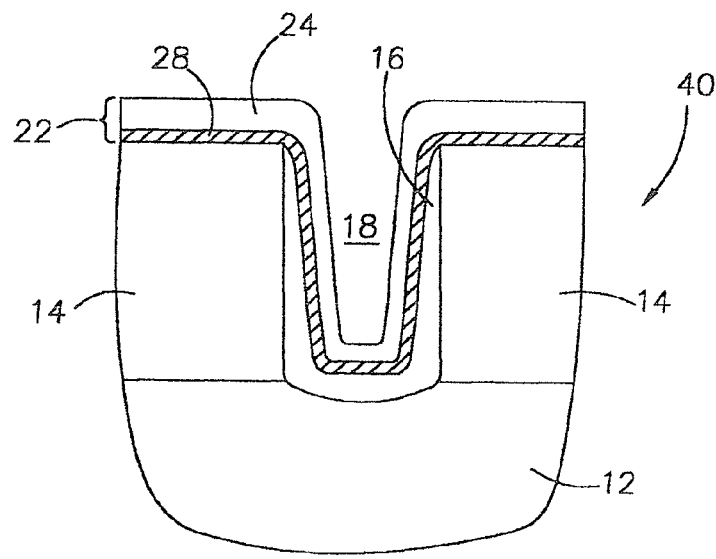
Figure 2D:
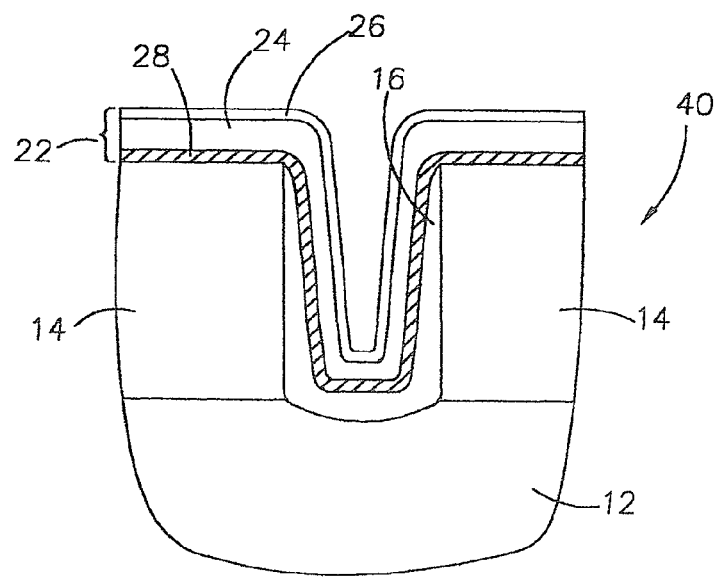

Referring to FIG. 2C, a TCS nitride layer 24 is then deposited on the thin DCS seeding layer 28 to a desired thickness. A conventional low pressure chemical vapor deposition (LPCVD) process can likewise be used for depositing the TCS nitride layer 24. The TCS nitride deposition process can be performed, for example, by the reaction of silicon tetrachloride ($SiCl_4$) and ammonia ($NH_3$) at a temperature of about 500° C. to about 800° C., a pressure in the range of about 50 mTorr to about 1500 mTorr, with a $NH_3:SiCl_4$ ratio of about 2:1 to about 1:2 to deposit a TCS silicon nitride layer to a thickness of up to about 50 angstroms, preferably about 45 to about 55 angstroms.

A preferred method for deposition of the TCS silicon nitride layer 24 is by LPCVD using silicon tetrachloride and ammonia. The preferred conditions for LPCVD include a temperature in the range of about 500° C. to about 800° C., a pressure in the range of about 50 mTorr to about 1500 mTorr, and an $NH_3:TCS$ ratio in the range of about 10:1 to about 1:2, preferably about 2:1 to about 1:2, to deposit a layer of about 3 angstroms to about 8 angstroms.

The method of the invention results in a silicon nitride layer having a resultant thickness of up to about 50 angstroms and reduced leakage current characteristics. Preferably, the total thickness of the dielectric silicon nitride-comprising layer 22 is about 40 to about 60 angstroms, preferably about 45 to about 55 angstroms.

Although LPCVD and the stated conditions are preferred, it is understood that conventional silicon nitride deposition processes other than LPCVD, can also be used to deposit suitable DCS and TCS silicon nitride layers. For example, such processes can include physical deposition processes, plasma enhanced chemical vapor deposition processes, and rapid thermal chemical vapor deposition processes, among others.

Systems for wafer pretreatment and silicon nitride deposition are well known to those skilled in the art, as described, for example, is U.S. Pat. No. 5,939,333, the disclosure of which is incorporated herein by reference. In an exemplary system for the silicon nitride formation process shown in FIGS. 3A-3E, the wafer surfaces may be pretreated in situ with respect to the silicon nitride formation step with an HF clean, such as an HF vapor clean in an HF vapor module (not shown). With such a system, the wafers are transferred from the pretreatment unit by a wafer transfer module to an LPCVD module (not shown) for the DCS and TCS silicon nitride deposition, without exposure to air to prevent native oxide formation. The wafers are then be positioned and sealed in the deposition chamber, whereupon heating elements bring the temperature of the chamber to about 640° C. to 800° C. Utilizing a pump, the system is then pumped down to a pressure of about 10 mTorr or less after which the deposition chamber is purged using $N_2$ or other inert gas. The system is then pumped down to a pressure of about 10 mTorr or less after which an $NH_3$ prepurge is performed during which the pressure is in the range of about 50 mTorr to about 700 mTorr. The DCS nitride deposition is then performed in accordance with conventional LPCVD processes according to the method and conditions described herein. Following the deposition of the DCS nitride layer, the deposition chamber is purged with $NH_3$ during which the pressure is in the range of about 50 mTorr to about 700 mTorr.

For the TCS nitride deposition, the system is then pumped down to a pressure of about 10 mTorr or less, the deposition chamber is purged with $N_2$ or other inert gas, and the system is pumped down again to a pressure of about 10 mTorr or less. An $NH_3$ prepurge is then performed during which the pressure is in the range of about 50 mTorr to about 700 mTorr. The TCS nitride deposition is performed in accordance with the conventional LPCVD process according to the method and conditions described herein. Following the deposition of the TCS nitride layer, the deposition chamber is purged with $NH_3$ during which the pressure is in the range of about 50 mTorr to about 700 mTorr, and then the system is pumped down to a pressure of about 10 mTorr or less. The deposition chamber is then vented to atmosphere using $N_2$ or other inert gas.

Figure 3A:
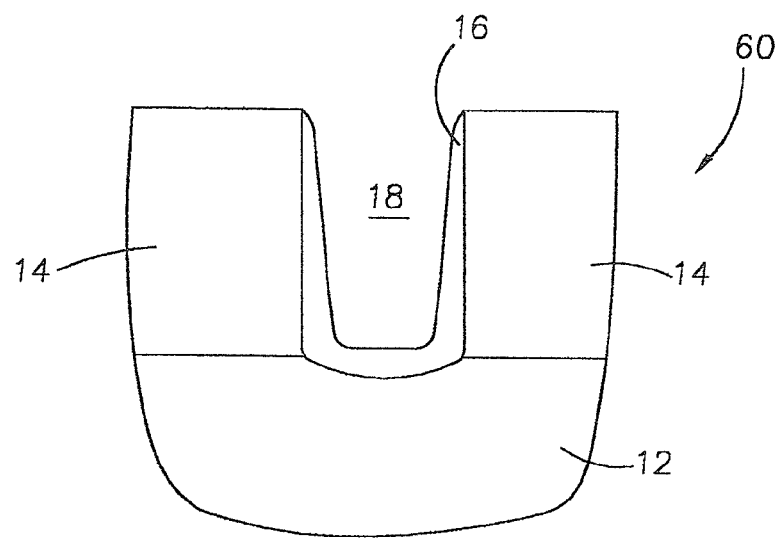
FIG. 3A is a diagrammatic cross-sectional view of a semiconductor wafer fragment at a preliminary step of a processing sequence to form a capacitor according to a second embodiment of the method of the present invention.
Figure 3B:
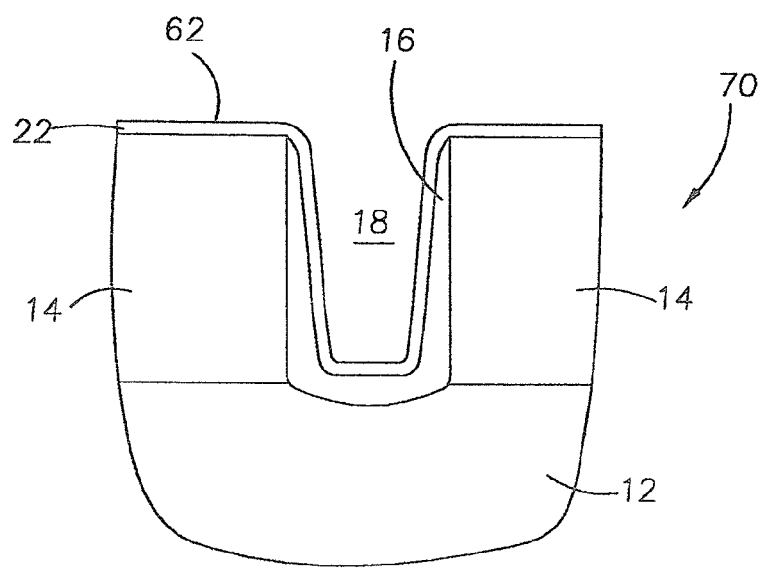
FIGS. 3B-3E are views of the wafer fragment of FIG. 3A at subsequent and sequential processing steps.
Figure 3C:
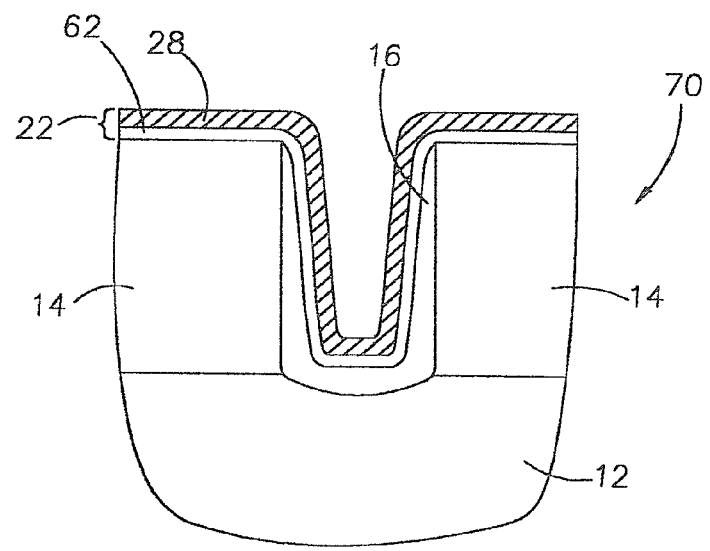
Figure 3D:
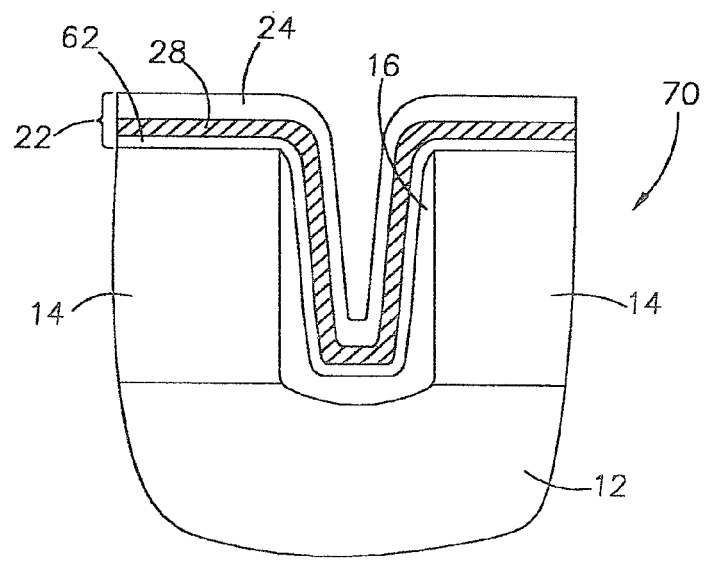
Figure 3E:
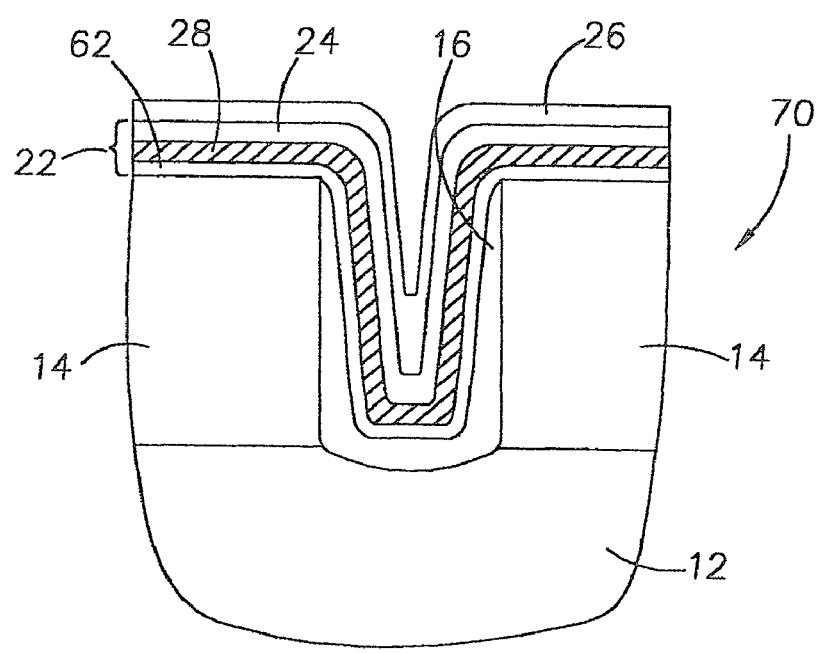

Referring now to FIGS. 3A-3E, a second embodiment of the method of the invention is described in a method of forming a capacitor 70. Referring to FIG. 3A, a semiconductor wafer fragment 60, identical to prior art wafer fragment 10 and wafer fragment 30, comprises a base layer 12, an insulative layer 14 deposited on a surface of the base layer 12, a silicon layer 16 overlying the insulative layer 14, and an opening 18. In an exemplary wafer fragment 60, the insulative layer 14 is BPSG, and the silicon layer 16 is HSG polysilicon. The HSG polysilicon layer 16 is incorporated into a capacitor construction 70, as a first capacitor plate layer. A silicon nitride-comprising dielectric layer 22 is formed intermediate the HSG polysilicon layer 16 and a second capacitor plate layer 26 (FIG. 3E).

According to the method, the surfaces of the BPSG layer 14 and the HSG polysilicon layer 16 are nitridized to form a silicon nitride layer 62 prior to the deposition of the DCS nitride seeding layer 28 and the TCS nitride layer 24. The nitridation of the BPSG layer 14 and the HSG polysilicon layers 16, increases the number of nucleation sites and nucleation rate for the subsequently deposited DCS nitride seeding layer 28.

The deposition of the silicon nitride-comprising layer using the nitridation step in accordance with the second embodiment of the invention is performed in substantially the same manner as described with respect to FIGS. 2A-2D with the addition of the nitridation step as shown in FIG. 3B. Therefore, the following description with reference to FIGS. 3A-3E will be limited to the nitridation step.

Referring to FIG. 3B, a thin silicon nitride layer 62 is formed over the BPSG layer 14 and the HSG polysilicon layers 16 by conventional nitridation methods typically used for forming a layer of silicon nitride on an oxide-free wafer surface. Such conventional methods typically include growing a silicon nitride film 62 on a silicon-comprising surface by exposing the surface to a nitrogen-comprising ambient. The nitrogen-comprising atmosphere may comprise $N_2$, $NH_3$ or $NO_x$, alone or in mixtures of two or more. Further, the nitrogen-comprising atmosphere may consist essentially of a gas selected from the group consisting of $N_2$, $NH_3$ or $NO_x$, and mixtures thereof. An exemplary nitridizing process comprises rapid thermal nitridation (RTN) of a silicon layer in a nitrogen-comprising atmosphere at a temperature of about 900° C. to about 1300° C., and a pressure of about 100 Torr to about 760 Torr.

Preferably, the BPSG layer 14 and the HSG polysilicon layers 16 are exposed to an atmosphere comprising ammonia ($NH_3$), at a temperature of about 500° C. to about 750° C. and a pressure of about 50 Torr to about 200 Torr to form a silicon nitride-comprising layer 62 to a thickness of less than three monolayers of silicon nitride, preferably one monolayer of silicon nitride, or up to about 2 angstroms, preferably up to about 5 angstroms.

Systems for nitridation of a silicon-comprising surface are well known in the art. In an exemplary system for nitridation of the wafer surface, the surfaces may be pretreated as discussed herein, for example, with an HF clean, and transferred to a conventional LPCVD module. The temperature of the chamber is brought up to about 400° C. to about 600° C. After pumping down the system to a pressure of about 1 mTorr to about 10 mTorr, the nitridation process is performed in an atmosphere of at least one of $N_2$, $NH_3$ or $NO_x$.

Below about 500° C., the surface coverage is typically a monolayer of silicon nitride 62, independent of temperature, although the time required to achieve the monolayer increases as temperature decreases. At about 550° C. to about 600° C., the surface typically exceeds a monolayer, and at about 600° C., the surface coverage may approach a double layer of silicon nitride. Suitable nitridation of the silicon based surfaces results in less than three monolayers of silicon nitride formation and preferably one monolayer or less.

After the nitridation of the BPSG layer 14 and the HSG polysilicon layers 16 to form silicon nitride layer 62, the system is then pumped down to a pressure of about 10 mTorr or less, followed by an $NH_3$ prepurge during which the pressure is in the range of about 50 mTorr to about 700 mTorr. The prepurge is then followed by the remainder of the steps to deposit the DCS nitride seeding layer 28 and the TCS nitride layer 24, as illustrated in FIGS. 3C-3D, and described with reference to FIGS. 2B-2C, to complete the silicon nitride deposition process.

Deposition of the DCS nitride seeding layer 28 preferably provides a thin layer of less than about 5 angstroms, preferably about 3-8 angstroms. The cross-wafer thickness of the TCS nitride layer 24 is substantially equivalent over the different wafer surfaces, i.e., the BPSG portion 14 and the HSG polysilicon portion 16, which results in improved electrical characteristics and mechanical properties for the semiconductor device being fabricated. Typically, the thickness of the TCS nitride layer can range from about 40 to about 60 angstroms.

The present invention is beneficial for all thin dielectric applications applications utilizing silicon nitride films. Such applications include, for example, the dielectrics for memory cells and gate dielectrics, among others. As such, the foregoing configurations are purely for illustration only and are not to be taken as limiting to the present invention as defined by the accompanying claims.

Example

DCS nitride and TCS nitride were deposited, alone and in combination, on a BPSG substrate to compare the measured thicknesses of the nitride layer and Cp-leakage performance.

There was a 10-minute $NH_3$ pre-anneal before the DCS seeding layer deposition. The time period of the $NH_3$ pre-anneal included a ramp-up time from 300° C. to 800° C. The DCS and TCS nitride depositions were at about 640° C. with pressure of 0.15 Torr and 0.2 Torr, respectively. After the cell nitride deposition, all wafers went through a standard wet re-oxidation (750° C., 105 Å target on Si blank test wafer).

The experimental details and results are shown below in Table 1 and depicted in FIGS. 4A-4F and FIG. 5. The results show that the deposition of a silicon nitride layer utilizing a DCS nitride seeding layer for TCS nitride offers the same electrical performance as a TCS nitride layer, and solves the "bubbling" problem of deposition of TCS nitride on BPSG in DRAM devices.

TABLE 1

| Group No. | Experimental nitride deposition on BPSG | FIG. | Nitride layer Thickness (Å) | Amount of bubbling of BPSG |
|---|---|---|---|---|
| 1 | Standard TCS nitride | 4a | 51 | Severe |
| 2 | 2 minute DCS seeding before the TCS deposition (29.6 mins.) | 4b | 51 | None |
| 3 | 5 minute DCS seeding before the TCS deposition (25.6 mins.) | 4c | 48 | None |
| 4 | 5 minute DCS seeding before the TCS deposition (29.6 mins.) | | 52 | None |
| 5 | 5 minute DCS seeding before the TCS deposition (33.6 mins.) | | 55 | None |
| 6 | DCS standard cell nitride | 4d | 56 | None |
| 7 | 20 minute $NH_3$ pre-anneal before the TCS deposition | 4e | 52 | Slight |
| 8 | 20 minute $NH_3$ pre-anneal before the TCS deposition | 4f | 47 | Slight |

Figures 4A, 4B, 4C, 4D, 4E, 4F:
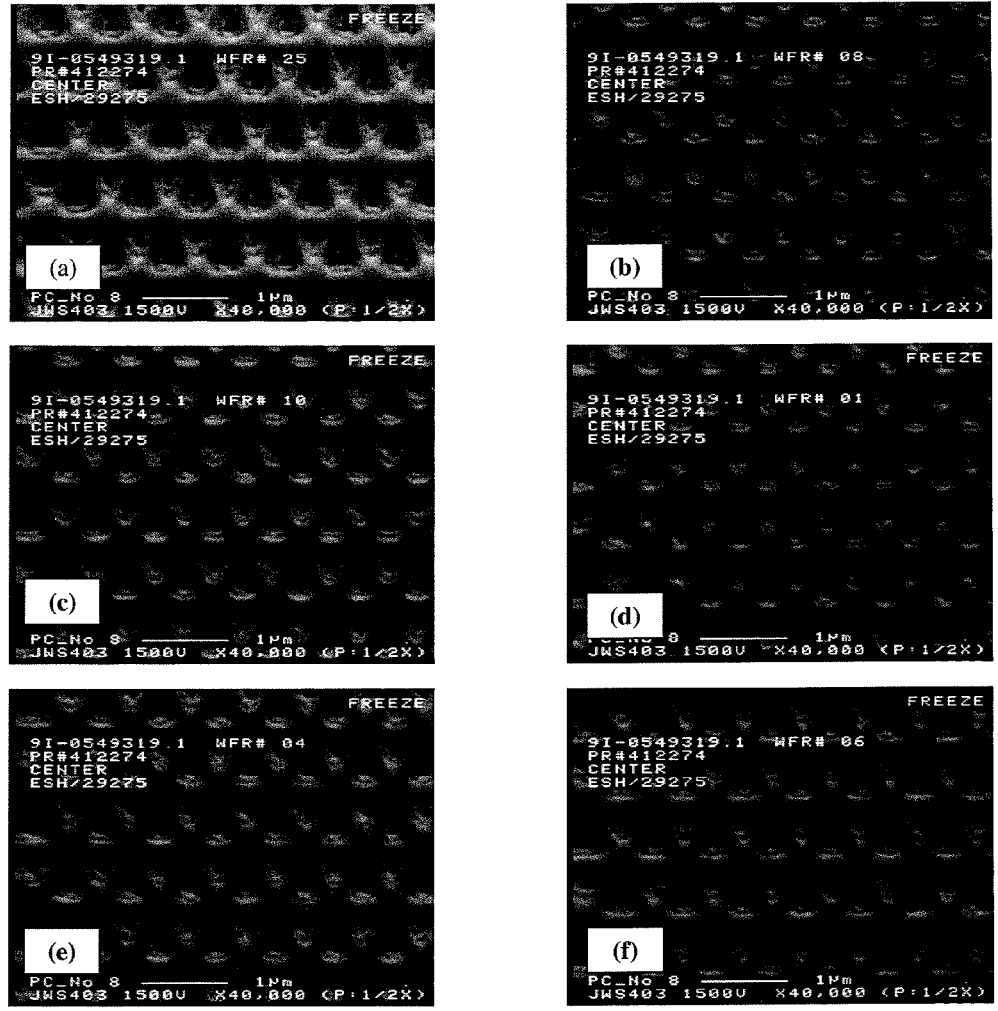
FIGS. 4a-4f are top views of SEM (scanning electron microscopy) images taken at the center of a wafer after top cell polysilicon deposition on BPSG.

FIG. 4a depicts a standard TCS deposition resulting in a nitride thickness of 51 Å at the edge of the wafer and severe "bubbling" of the BPSG at the center of a wafer.

In order overcome such shortcomings of a TCS nitride layer on BPSG, a deposition process was performed by combining the DCS nitride with the TCS nitride. In one run, before the deposition of TCS nitride, a very thin DCS nitride was deposited as an interface seeding layer. This process produced a TCS+DCS nitride layer having a thickness of 51 Å and 48 Å across the whole surface of the wafer without "bubbling" of the BPSG (FIGS. 4b and 4c).

FIG. 4d depicts a DCS standard nitride layer that is 56 Å thick with no bubbling of the BPSG.

FIGS. 4e and 4f illustrate "bubbling" of the BPSG with nitride layers 52 Å and 47 Å thick that were formed with a 20-minute $NH_3$ pre-anneal before the TCS nitride deposition. These results show that the use of a DCS nitride seeding layer was more effective than increasing the $NH_3$ pre-anneal time.

The results also showed that Cp-leakage performance of a TCS nitride layer that included a DCS seeding layer was much better than a DCS nitride layer alone and comparable to a TCS nitride layer alone. This indicated that DCS nitride seeding layer functioned as an interface layer to improve the surface condition for TCS nitride on BPSG without substantially decreasing the superior electrical properties of the overall nitride film.

Figure 5:
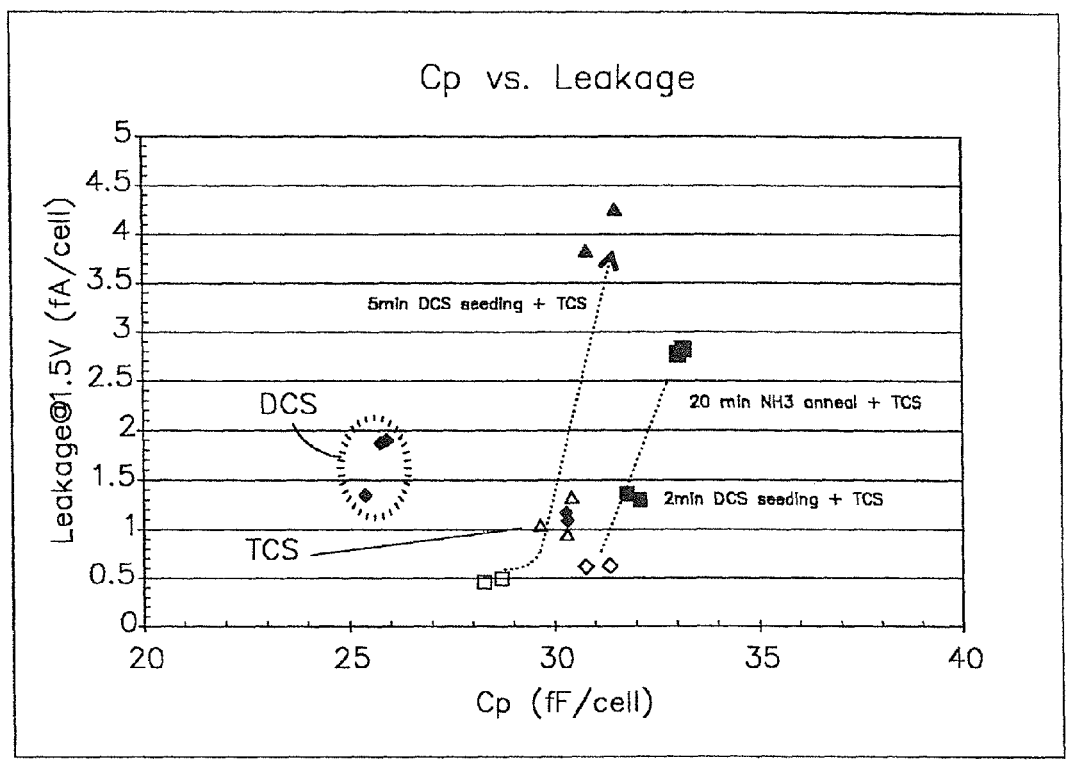
FIG. 5 is a graphical depiction of capacitance (Cp) versus leakage performance of the deposited structures of FIGS. 4a-4f.

FIG. 5 is a graphical comparison of Cp-leakage for the TCS nitride layer combined with a DCS seeding layer and deposited on BPSG, and for the standard DCS nitride layer and standard TCS nitride layer, in TEL fast ramp furnace for a 91 short loop lot. The process details of each group is listed in Table 1, above. The data in FIG. 5 shows that all TCS nitride test groups were better than the DCS standard nitride, and the TCS nitrides with DCS seeding layer were comparable to the pure TCS nitride film.

In compliance with the statute, the invention has been described in language more or less specific as to structural and methodical features. It is to be understood, however, that the invention is not limited to the specific features shown and described, since the means herein disclosed comprise preferred forms of putting the invention into effect. Although the invention has been described with particular reference to preferred embodiments thereof, variations and modifications of the present invention can be made within a contemplated scope of the following claims as is readily known to one skilled in the art. The invention is, therefore, claimed in any of its forms or modifications within the proper scope of the appended claims appropriately interpreted in accordance with the doctrine of equivalents.

What is claimed is:

1. A silicon nitride layer, comprising:
a first nitride layer overlying and in contact with a silicon-comprising substrate, said first nitride layer having a thickness of up to about 8 angstroms and derived from dichlorosilane and ammonia; and
a second nitride layer overlying and in contact with the first nitride layer, said second nitride layer having a thickness of about 40-60 angstroms and derived from silicon tetrachloride and ammonia.

2. A silicon nitride layer, comprising:
a first nitride layer overlying and in contact with a silicon-comprising substrate, said first nitride layer having a thickness of up to about 8 angstroms and derived from dichlorosilane and ammonia; and
a second nitride layer overlying and in contact with the first nitride layer and having a thickness of up to about 60 angstroms, said second nitride layer derived from silicon tetrachloride and ammonia.

3. A silicon nitride layer, comprising:
a nitride seed layer having a thickness of up to about 8 angstroms and overlying and in contact with a silicon-comprising substrate and derived from dichlorosilane and ammonia; and
a nitride layer over and in contact with the nitride seed layer and derived from silicon tetrachloride and ammonia, said nitride layer having a thickness of about 40-60 angstroms.

4. The silicon nitride layer of claim 3, being a gate dielectric layer.

5. A silicon nitride layer, comprising:
a first nitride layer on and in contact with the surface of at least two different substrate types, the first nitride layer having a thickness of up to about 8 angstroms and derived from dichlorosilane and ammonia; and
a second nitride layer over and in contact with the first nitride layer and having a thickness of about 40-60 angstroms that is substantially equivalent over the at least two different substrate types, the second nitride layer derived from silicon tetrachloride and ammonia.

6. A silicon nitride barrier layer, comprising:
a nitride seed layer having a thickness of up to about 8 angstroms and derived from dichlorosilane and ammonia, on and in contact with a silicon-comprising substrate; and
a nitride layer derived from silicon tetrachloride and ammonia, over and in contact with the nitride seed layer and having a thickness of about 40-60 angstroms effective to prevent diffusion of oxygen therethrough to the silicon-comprising substrate.

7. A silicon nitride barrier layer, comprising:
a nitride seed layer having a thickness of up to about 8 angstroms and derived from dichlorosilane and ammonia, on and in contact with a substrate; and
a nitride layer derived from silicon tetrachloride and ammonia, over and in contact with the nitride seed layer and having a thickness of about 40-60 angstroms effective to prevent diffusion of $H_2$ therethrough to the substrate.

8. The barrier layer of claim 7, wherein the substrate comprises an insulative material.

9. The barrier layer of claim 8, wherein the insulative substrate is selected from the group consisting of tetraethylorthosilicate, borophosphosilicate glass, and silicon dioxide.

10. An integrated circuit, comprising:
a silicon nitride layer comprising:
a first nitride layer on and in contact with a silicon-comprising substrate and derived from dichlorosilane and ammonia, the first nitride layer having a thickness of up to about 8 angstroms; and
a second nitride layer about 40-60 angstroms thick on and in contact with the first nitride layer and derived from silicon tetrachloride and ammonia.

11. An integrated circuit, comprising:
a silicon nitride layer comprising:
a first nitride layer on and in contact with a silicon-comprising substrate and derived from dichlorosilane and ammonia, the first nitride layer having a thickness of up to about 8 angstroms; and
a second nitride layer on and in contact with the first nitride layer and having a thickness of up to about 60 angstroms and derived from silicon tetrachloride and ammonia.

12. An integrated circuit, comprising:
a silicon nitride layer comprising:
a nitride seed layer on and in contact with a silicon-comprising substrate, the nitride seed layer having a thickness of up to about 8 angstroms and derived from dichlorosilane and ammonia; and
a nitride layer about 40-60 angstroms thick on and in contact with the nitride seed layer, the nitride layer derived from silicon tetrachloride and ammonia.

13. An integrated circuit, comprising:
a silicon nitride layer comprising:
a first nitride layer on and in contact with a silicon-comprising substrate selected from the group consisting of silicon, polysilicon, hemispherical grain polysilicon, a doped silicon, and a doped polysilicon, the first nitride layer having a thickness of up to about 8 angstroms and derived from dichlorosilane and ammonia; and
a second nitride layer about 40-60 angstroms thick on and in contact with the first nitride layer, the second nitride layer derived from silicon tetrachloride and ammonia.

14. An integrated circuit, comprising:
a silicon nitride layer comprising:
a first nitride layer on and in contact with a substrate comprising at least two different material types, the first nitride layer having a thickness of up to about 8 angstroms and derived from dichlorosilane and ammonia; and a second nitride layer over and in contact with the first nitride layer and having a thickness of about 40-60 angstroms that is substantially equivalent over the at least two different material types of the substrate, the second nitride layer derived from silicon tetrachloride and ammonia.

15. The integrated circuit of claim 14, wherein the at least two different substrate types comprise an insulative material and a silicon material.

16. An integrated circuit, comprising:
a silicon nitride layer comprising:
a first nitride layer on and in contact with a silicon material and an insulative material, the first nitride layer having a thickness of up to about 8 angstroms and derived from dichlorosilane and ammonia; and
a second nitride layer over and in contact with the first nitride layer and having a thickness of about 40-60 angstroms that is substantially equivalent over the silicon material and the insulative material, the second nitride layer derived from silicon tetrachloride and ammonia.

17. The integrated circuit of claim 16, wherein the insulative material is selected from the group consisting of tetraethylorthosilicate, borophosphosilicate glass, and silicon dioxide.

18. The integrated circuit of claim 16, wherein the silicon material is selected from the group consisting of silicon, polysilicon, hemispherical grain polysilicon, doped silicon, and doped polysilicon.

19. A semiconductor wafer, comprising:
a silicon nitride layer comprising:
a nitride seed layer having a thickness of up to about 8 angstroms and derived from dichlorosilane and ammonia, and on and in contact with a silicon-comprising substrate; and
a nitride layer about 40-60 angstroms thick and derived from silicon tetrachloride and ammonia, over and in contact with the nitride seed layer.

20. A semiconductor wafer, comprising:
a silicon nitride layer comprising:
a nitride seed layer derived from dichlorosilane and ammonia, on and in contact with a silicon-comprising substrate and having a thickness of up to about 8 angstroms; and
a nitride layer derived from silicon tetrachloride and ammonia, over and in contact with the nitride seed layer and having a thickness of up to about 60 angstroms.

21. A semiconductor wafer, comprising:
a silicon nitride layer on and in contact with a surface of at least two different substrate types, the silicon nitride layer comprising:
a first nitride layer on and in contact with the surface of the at least two different substrate types, the first nitride layer having a thickness of up to about 8 angstroms and derived from dichlorosilane and ammonia; and
a second nitride layer over and in contact with the first nitride layer and having a thickness of about 40-60 angstroms that is substantially equivalent over the at least two different substrate types, the second nitride layer derived from silicon tetrachloride and ammonia.

22. In a gate structure in a semiconductor device, a silicon nitride layer comprising:

a nitride seed layer on and in contact with a silicon-comprising substrate, the nitride seed layer having a thickness of up to about 8 angstroms and derived from dichlorosilane and ammonia; and
a nitride layer about 40-60 angstroms thick over and in contact with the dichlorosilane nitride seed layer, the nitride layer derived from silicon tetrachloride and ammonia.

23. The gate structure of claim 22, wherein the nitride layer has a thickness effective to prevent diffusion of oxygen therethrough to the silicon-comprising substrate.

24. A memory cell, comprising:
a silicon nitride layer comprising:
a first nitride layer having a thickness of up to about 8 angstroms on and in contact with a silicon-comprising substrate, the first nitride layer derived from dichlorosilane and ammonia; and
a second nitride layer having a thickness of up to about 60 angstroms over and in contact with the first nitride layer, the second nitride layer derived from silicon tetrachloride and ammonia.

25. A memory cell, comprising:
a silicon nitride layer on and in contact with a surface of at least two different substrate types, the silicon nitride layer comprising:
a first nitride layer on and in contact with the surface of the at least two different substrate types, the first nitride layer having a thickness of up to about 8 angstroms and derived from dichlorosilane and ammonia; and
a second nitride layer over and in contact with the first nitride layer and having a thickness of about 40-60 angstroms that is substantially equivalent over the at least two different substrate types, the second nitride layer derived from silicon tetrachloride and ammonia.

26. A memory cell, comprising:
a capacitor having a dielectric layer over and in contact with a silicon-comprising electrode, the dielectric layer comprising:
a first nitride layer having a thickness of up to about 8 angstroms over and in contact with the silicon-comprising electrode, the first nitride layer derived from dichlorosilane and ammonia; and
a second nitride layer having a thickness of up to about 60 angstroms over and in contact with the first nitride layer, the second nitride layer derived from silicon tetrachloride and ammonia.

27. A memory cell, comprising:
a capacitor having a dielectric layer over and in contact with a silicon-comprising electrode and an insulative substrate, the dielectric layer comprising:
a first nitride layer over and in contact with the silicon-comprising electrode and the insulative substrate, the first nitride layer having a thickness of up to about 8 angstroms and derived from dichlorosilane and ammonia; and
a second nitride layer over and in contact with the first nitride layer and having a thickness of about 40-60 angstroms that is substantially equivalent over the silicon-comprising electrode and the insulative substrate, and derived from silicon tetrachloride and ammonia.

28. A memory module comprising:
a memory cell with a capacitor having a dielectric layer over and in contact with a silicon-comprising electrode, the dielectric layer comprising:

a first nitride layer having a thickness of up to about 8 angstroms on and in contact with the silicon-comprising electrode, the first nitride layer derived from dichlorosilane and ammonia; and a second nitride layer having a thickness of up to about 60 angstroms over and in contact with the first nitride layer, the second nitride layer derived from silicon tetrachloride and ammonia.

29. The memory module of claim 28, being a DRAM module.

30. A memory module comprising:

a memory cell with a capacitor having a dielectric layer over and in contact with a silicon-comprising electrode and an insulative substrate, the dielectric layer comprising:

a first nitride layer having a thickness of up to about 8 angstroms and derived from dichlorosilane and ammonia, the first nitride layer on and in contact with the surface of the silicon-comprising electrode and the insulative substrate; and a second nitride layer derived from silicon tetrachloride and ammonia, the second nitride layer over and in contact with the first nitride layer and having a thickness of about 40-60 angstroms that is substantially equivalent over the silicon-comprising electrode and the insulative substrate.

* * * * *